United States Patent
Khan et al.

(10) Patent No.: US 10,942,847 B2
(45) Date of Patent: Mar. 9, 2021

(54) TECHNOLOGIES FOR EFFICIENTLY PERFORMING SCATTER-GATHER OPERATIONS

(71) Applicant: Intel Corporation, Santa Clara, CA (US)

(72) Inventors: Jawad B. Khan, Portland, OR (US); Richard Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/223,539

(22) Filed: Dec. 18, 2018

(65) Prior Publication Data

US 2019/0121731 A1    Apr. 25, 2019

(51) Int. Cl.
*G06F 12/02*    (2006.01)
*G06F 12/0866*    (2016.01)
*G11C 13/00*    (2006.01)

(52) U.S. Cl.
CPC ...... *G06F 12/0246* (2013.01); *G06F 12/0866* (2013.01); *G11C 13/003* (2013.01); *G11C 13/0023* (2013.01); *G11C 13/0026* (2013.01); *G11C 13/0028* (2013.01); *G06F 2212/7204* (2013.01); *G11C 2213/71* (2013.01); *G11C 2213/77* (2013.01)

(58) Field of Classification Search
CPC ............ G06F 12/0246; G06F 12/0866; G06F 2212/7204; G11C 13/0026; G11C 13/0028; G11C 13/003; G11C 2213/71; G11C 2213/77

USPC ...................................................... 711/154
See application file for complete search history.

(56) References Cited

U.S. PATENT DOCUMENTS

| | | | |
|---|---|---|---|
| 8,495,467 B1 | 7/2013 | Billing et al. | |
| 8,996,953 B2 | 3/2015 | Cordero et al. | |
| 10,164,618 B1 * | 12/2018 | Shi | H03K 5/065 |
| 2008/0301529 A1 | 12/2008 | Sloanel et al. | |
| 2010/0332943 A1 | 12/2010 | d'Abreu et al. | |
| 2011/0161726 A1 | 6/2011 | Swanson et al. | |
| 2015/0074373 A1 * | 3/2015 | Sperber | G06F 9/30145 |
| | | | 712/7 |

FOREIGN PATENT DOCUMENTS

| | | |
|---|---|---|
| CN | 1691202 A | 11/2005 |
| CN | 1815615 A | 8/2006 |
| WO | 9808166 A1 | 2/1998 |

OTHER PUBLICATIONS

Chinese and English Translation of P.R. China State Intellectual Property Office First Office Action for Patent Application No. 201680024940.1, dated Oct. 23, 2020, 7 pages.

* cited by examiner

*Primary Examiner* — Hua J Song
(74) *Attorney, Agent, or Firm* — Compass IP Law, PC (57) ABSTRACT

Technologies for efficiently performing scatter-gather operations include a device with circuitry configured to associate, with a template identifier, a set of non-contiguous memory locations of a memory having a cross point architecture. The circuitry is additionally configured to access, in response to a request that identifies the non-contiguous memory locations by the template identifier, the memory locations.

19 Claims, 6 Drawing Sheets

*Scatter gather template may apply to a three dimensional stack of data units.*

FIG. 8

*Scatter gather result from a defined template. Data units with a rectangular border are to be accessed.*

FIG. 7

*Scatter gather template.*

FIG. 6

TECHNOLOGIES FOR EFFICIENTLY PERFORMING SCATTER-GATHER OPERATIONS

BACKGROUND

Certain classes of compute operations, such as sparse linear algebra operations, involve writing a contiguous set (e.g., an array) of data to non-contiguous locations in memory (e.g., scatter operations) and reading a data set from non-contiguous locations in memory (e.g., gather operations) into a contiguous set (e.g., an array). Such operations may be useful in machine learning, graphics processing, and other applications. One drawback to performing scatter-gather operations is, given that the memory locations are non-contiguous, each memory location must be specified separately (e.g., in a scatter or gather request made by an application executed on a processor of the compute device), rather than merely specifying a single memory location and a length, or end memory location. In situations in which the memory capacity is relatively high, each memory location may require a large number of bits to express (e.g., as an address) and accordingly, managing (e.g., parsing, providing the addresses to a memory controller through an I/O subsystem, etc.) the memory locations for a particular scatter or gather operation may be time and energy intensive and may limit the speed at which the application (e.g., machine learning, graphics processing, etc.) is performed.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 1:
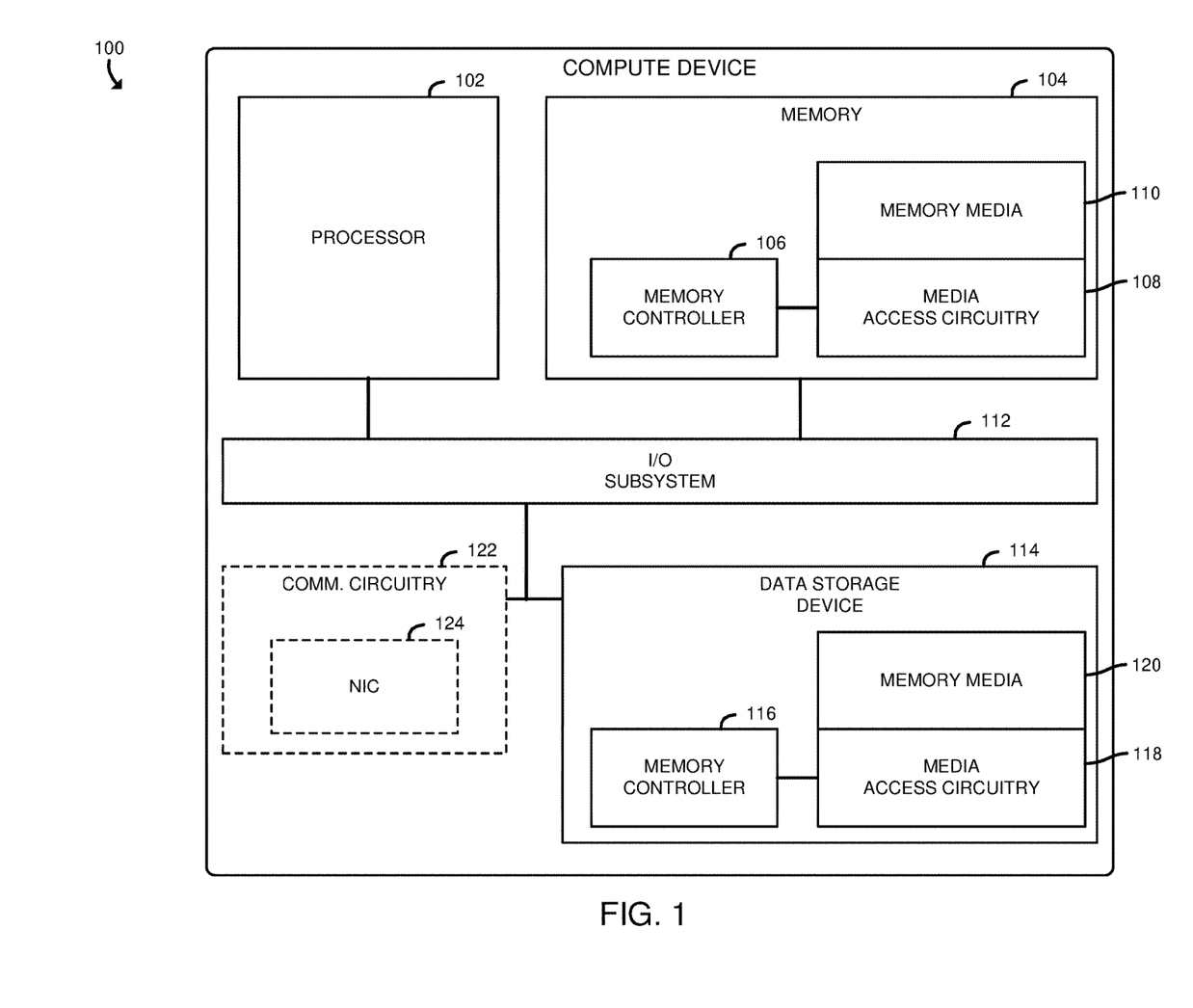
FIG. 1 is a simplified diagram of at least one embodiment of a compute device for efficiently performing scatter-gather operations.

Referring now to FIG. 1, a compute device 100 for performing efficient scatter operations and gather operations (collectively referred to as "scatter-gather operations") includes a processor 102, memory 104, an input/output (I/O) subsystem 112, a data storage device 114, and communication circuitry 122. Of course, in other embodiments, the compute device 100 may include other or additional components, such as those commonly found in a computer (e.g., a display, peripheral devices, etc.). Additionally, in some embodiments, one or more of the illustrative components may be incorporated in, or otherwise form a portion of, another component. As described herein, the compute device 100, and in particular, the memory 104 of the compute device 100 enables efficient scatter-gather operations by storing one or more templates, each indicative of a set of memory locations to be accessed (e.g., written to or read from) upon request (e.g., in response to a request from the processor 102, which may be executing an application requesting the scatter or gather operation). As such, rather than requiring the processor 102 to send (e.g., through the I/O subsystem 112) a set of memory locations each time a scatter or gather operation is requested, the processor 102 instead only sends an identifier of a defined template indicative of the memory locations to be accessed for the corresponding scatter or gather operation. Accordingly, as compared to typical compute devices, the compute device 100, and in particular, the memory 104, enable scatter-gather operations to be performed with significantly lower overhead (e.g., in terms of energy and time) and may increase the speed at which applications that rely on the scatter-gather operations are performed.

The processor 102 may be embodied as any device or circuitry (e.g., a multi-core processor(s), a microcontroller, or other processor or processing/controlling circuit) capable of executing a workload (e.g., a set of operations, such as an application that may produce requests to read from and/or write to memory locations, such as non-contiguous memory locations) and/or performing other operations described herein. In some embodiments, the processor 102 may be embodied as, include, or be coupled to an FPGA, an application specific integrated circuit (ASIC), reconfigurable hardware or hardware circuitry, or other specialized hardware to facilitate performance of the functions described herein.

Figure 2:
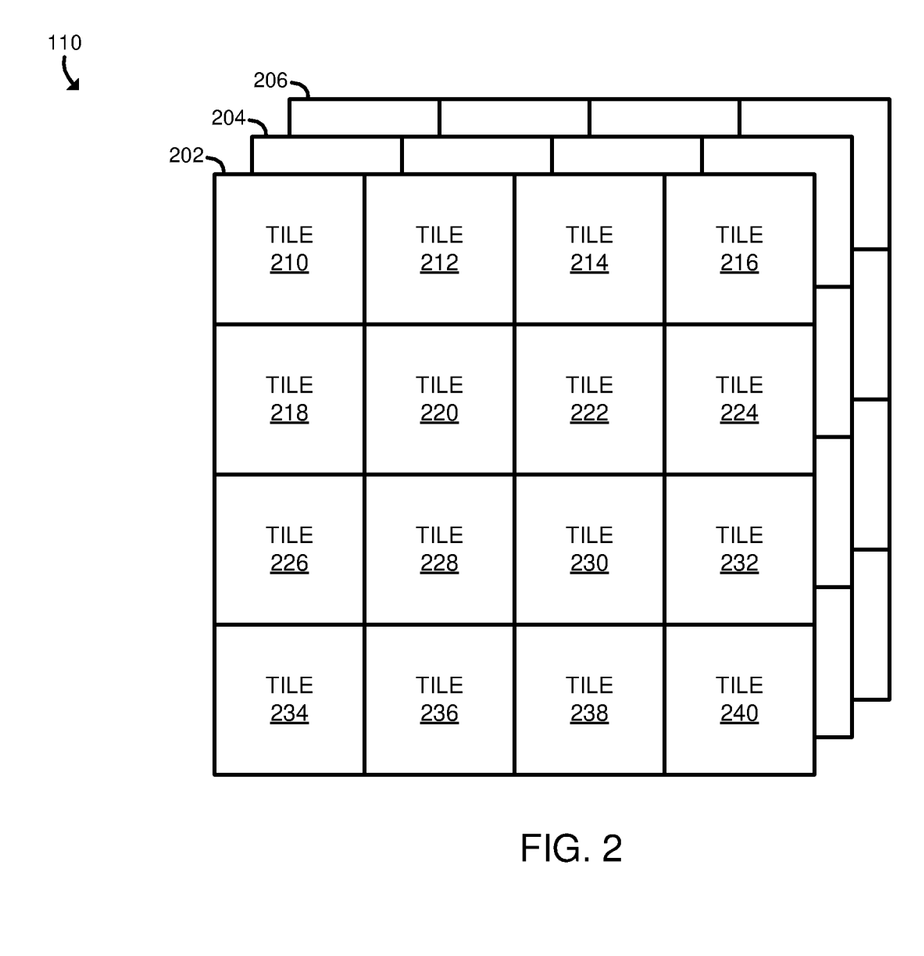
FIG. 2 is a simplified diagram of at least one embodiment of a memory media included in the compute device of FIG. 1.

The memory 104, which may include a non-volatile memory (e.g., a far memory in a two-level memory scheme), includes a memory media 110 and media access circuitry 108 (e.g., a device or circuitry, such as integrated circuitry constructed from complementary metal-oxide-semiconductors (CMOS) or other materials) underneath the memory media 110. The media access circuitry 108 is also connected to a memory controller 106, which may be embodied as any device or circuitry (e.g., a processor, a co-processor, dedicated circuitry, etc.) configured to selectively read from and/or write to the memory media 110 (e.g., in response to requests from the processor 102, which may be executing an application seeking to read from or write to the memory media 110). Referring briefly to FIG. 2, the memory media 110, in the illustrative embodiment, includes a set of tiles 210, 212, 214, 216, 218, 220, 222, 224, 226, 228, 230, 232, 234, 236, 238, 240 (e.g., each an addressable section of the memory media 110 capable of retaining data) arranged in a cross point architecture (e.g., an architecture in which memory cells sit at the intersection of word lines and bit lines and are individually addressable and in which bit storage is based on a change in bulk resistance), in which each tile is addressable by an x parameter and a y parameter (e.g., a column and a row). A set of tiles form a partition and multiple partitions may be stacked as layers 202, 204, 206 to form a three-dimensional cross point architecture (e.g., Intel 3D XPoint™ memory). Unlike typical memory devices, in which only fixed-size multiple-bit data structures (e.g., byte, words, etc.) are addressable, the media access circuitry 108 is configured to read individual bits, or other units of data, from the memory media 110 at the request of the memory controller 106, which may produce the request in response to receiving a corresponding request from the processor 102.

In the illustrative embodiment, an application executed by the processor 102 of the compute device may define a set of non-contiguous addresses (e.g., x and y coordinates, wherein each x and y (e.g., column and row) coordinate combination corresponds to a tile or a set of tiles (extending up a stack of partitions, in a z direction)), referred to herein as a template. In the illustrative embodiment, the application (e.g., the processor 102 executing the application) may send a request to the memory controller 106 to define a given template, and in response the memory controller 106 may store the template (e.g., a series of addresses of memory locations) in association with an identifier for the template (e.g., an index number). Subsequently, the memory controller 106 may, in a single write operation (rather than a sequence of write operations), write a set of data to the memory locations identified in the template (e.g., in response to a scatter request, from the application, that includes the data to be written and the reference to the template). Similarly, the memory controller 106 may, in a single read operation (rather than a sequence of read operations), read a set of data from the memory locations identified in the template (e.g., in response to a gather request, from the application, that identifies the template). In some embodiments, multiple data units, such as multiple bits, are associated with a given column and row pair (e.g., because the memory media 110 contains a stack of layers 202, 204, 206).

The memory 104 may include non-volatile memory and volatile memory. The non-volatile memory may be embodied as any type of data storage capable of storing data in a persistent manner (even if power is interrupted to the non-volatile memory). For example, the non-volatile memory may be embodied as one or more non-volatile memory devices. The non-volatile memory devices may include one or more memory devices configured in a cross-point architecture that enables bit-level addressability (e.g., the ability to read from and/or write to individual bits of data, rather than bytes or other larger units of data), and are illustratively embodied as three-dimensional (3D) crosspoint memory. In some embodiments, the non-volatile memory may additionally include other types of memory, including any combination of memory devices that use chalcogenide phase change material (e.g., chalcogenide glass), ferroelectric transistor random-access memory (Fe-TRAM), nanowire-based non-volatile memory, phase change memory (PCM), memory that incorporates memristor technology, Magnetoresistive random-access memory (MRAM) or Spin Transfer Torque (STT)-MRAM. The volatile memory may be embodied as any type of data storage capable of storing data while power is supplied volatile memory. For example, the volatile memory may be embodied as one or more volatile memory devices, and is periodically referred to hereinafter as volatile memory with the understanding that the volatile memory may be embodied as other types of non-persistent data storage in other embodiments. The volatile memory may have an architecture that enables bit-level addressability, similar to the architecture described above.

The processor 102 and the memory 104 are communicatively coupled to other components of the compute device 100 via the I/O subsystem 112, which may be embodied as circuitry and/or components to facilitate input/output operations with the processor 102 and/or the main memory 104 and other components of the compute device 100. For example, the I/O subsystem 112 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 112 may form a portion of a system-on-a-chip (SoC) and be incorporated, along with one or more of the processor 102, the main memory 104, and other components of the compute device 100, in a single chip.

The data storage device 114, may be embodied as any type of device configured for short-term or long-term storage of data such as, for example, memory devices and circuits, memory cards, hard disk drives, solid-state drives, or other data storage device. In the illustrative embodiment, the data storage device 114 includes a memory controller 116, similar to the memory controller 106, media access circuitry 118, similar to the media access circuitry 108, and memory media 120, similar to the memory media 110. As such, in the illustrative embodiment, the data storage device 114 (e.g., the memory controller 116) is capable of efficiently performing scatter-gather operations on the memory media 120. The data storage device 114 may include a system partition that stores data and firmware code for the data storage device 114 and one or more operating system partitions that store data files and executables for operating systems.

The communication circuitry 122 may be embodied as any communication circuit, device, or collection thereof, capable of enabling communications over a network between the compute device 100 and another device. The communication circuitry 122 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 122 includes a network interface controller (NIC) 122, which may also be referred to as a host fabric interface (HFI). The NIC 124 may be embodied as one or more add-in-boards, daughter cards, network interface cards, controller chips, chipsets, or other devices that may be used by the compute device 100 to connect with another compute device. In some embodiments, the NIC 124 may be embodied as part of a system-on-a-chip (SoC) that includes one or more processors, or included on a multichip package that also contains one or more processors. In some embodiments, the NIC 124 may include a local processor (not shown) and/or a local memory (not shown) that are both local to the NIC 124. In such embodiments, the local processor of the NIC 124 may be capable of performing one or more of the functions of the processor 102. Additionally or alternatively, in such embodiments, the local memory of the NIC 124 may be integrated into one or more components of the compute device 100 at the board level, socket level, chip level, and/or other levels.

Figure 3:
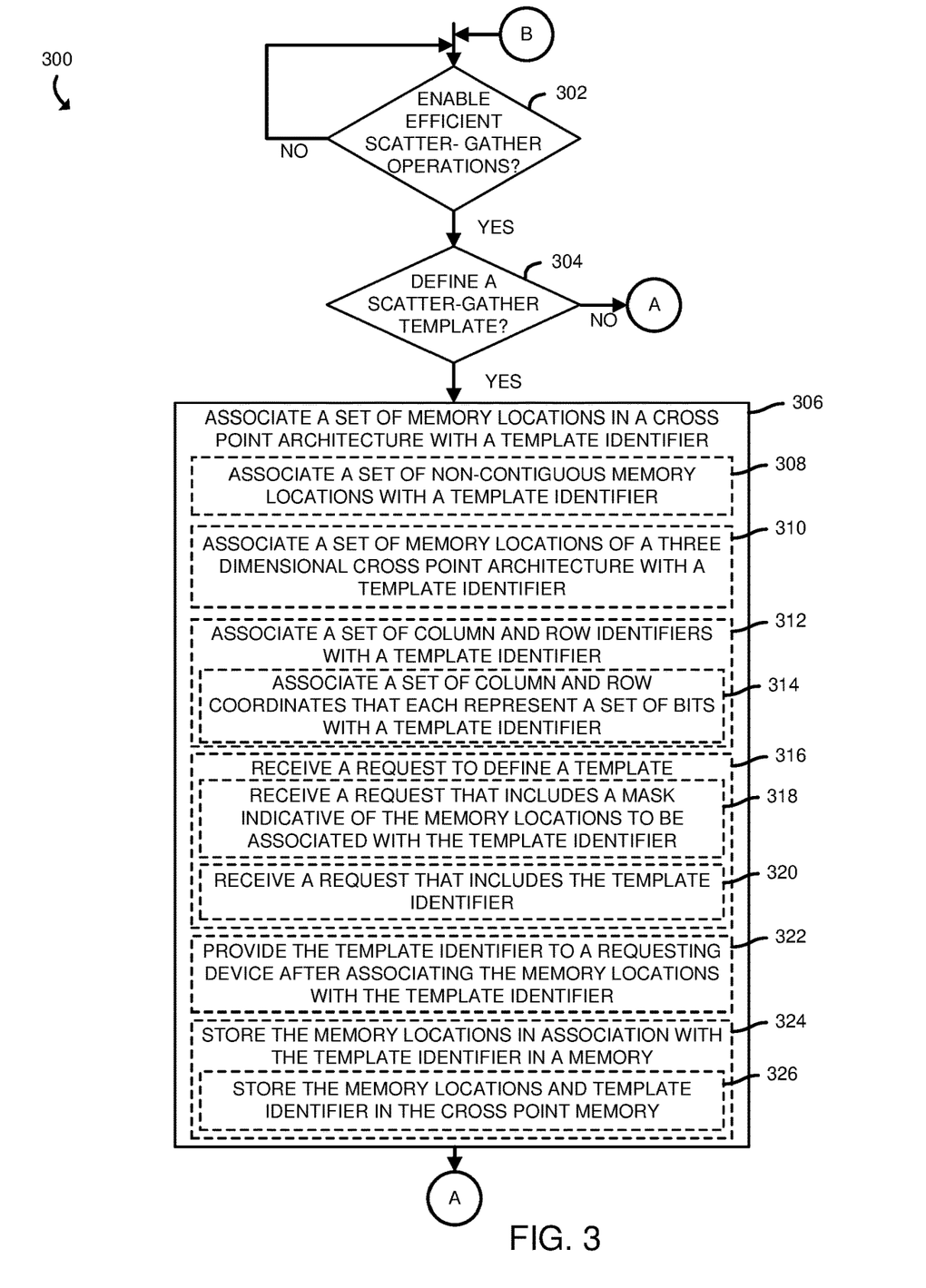
FIGS. 3-5 are a simplified diagram of at least one embodiment of a method for performing efficient scatter-gather operations by the compute device of FIG. 1.

Referring now to FIG. 3, the compute device 100, in operation, may execute a method 300 for performing efficient scatter-gather operations. The method 300 is described with reference to the memory 104. However, it should be understood that the method 300 could be additionally or alternatively performed using the memory of the data storage device 114. The method 300 begins with block 302, in which the compute device 100 determines whether to enable efficient scatter-gather operations (e.g., whether to perform the operations of the method 300). In making the determination, the compute device 100 may determine whether the memory controller 106 is configured to perform efficient scatter-gather operations (e.g., based on querying the memory controller 106 as to whether the memory controller 106 is capable of writing to and reading from memory locations defined in a template), in response to a request from the processor 102 (e.g., by an application executed by the processor 102) to enable efficient scatter-gather operations, and/or based on other factors. Regardless, in response to a determination to enable efficient scatter-gather operations, the method 300 advances to block 304 in which the compute device 100 determines whether to define a scatter-gather template.

Initially, if no templates have been defined or if additional or replacement templates are to be defined (e.g., in a setup phase of an application executed by the processor 102), the method 300 may advance to block 306 in which the compute device 100 (e.g., the memory controller 106) associates, with a template (e.g., a scatter-gather template), a set of memory locations in a cross point architecture (e.g., the architecture of the memory media 110). In doing so, and as indicated in block 308, the compute device 100 (e.g., the memory controller 106) may associate a set of non-contiguous memory locations (e.g., at least one of the memory locations is not contiguous with any of the other memory locations) with a template identifier which may be embodied as a number, an alphanumeric code, or other data to uniquely identify the set of memory locations as a template. In the illustrative embodiment, and as indicated in block 310, the compute device 100 (e.g., the memory controller 106) associates a set of memory locations of a three dimensional cross point architecture with the template identifier (e.g., the memory media 110 has a three dimensional cross point architecture, such as the architecture described with reference to FIG. 2).

Figure 6:
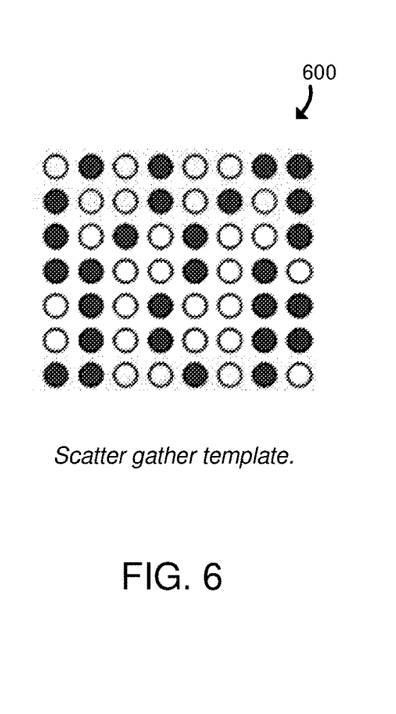
FIG. 6 is a simplified diagram of at least one embodiment of a template that may be used by the compute device of FIG. 1 for scatter-gather operations.

Still referring to FIG. 3, in associating the set of memory locations with a template identifier, the compute device 100 (e.g., the memory controller 106) may associate a set of column and row identifiers with the template identifier, as indicated in block 312. In doing so, and as indicated in block 314, the compute device 100 (e.g., the memory controller 106) may associate, with the template identifier, a set of column and row coordinates that each represent a set of bits (e.g., for each layer of a stack in a three dimensional cross point architecture, a bit is accessible at the given column and row). As indicated in block 316, the compute device 100 (e.g., the memory controller 106) may receive a request (e.g., from the processor 102, which may be executing an application that has requested to define the template) to define the template. In doing so, and as indicated in block 318, the compute device 100 (e.g., the memory controller 106) may receive a request (e.g., from the processor 102) that includes a mask (e.g., a bitmap) indicative of the memory locations to be associated with the template identifier. Referring briefly to FIG. 6, a template 600 may be embodied as a mask (e.g., a bitmap) in which, for a given location in the mask, if the value is a one, then the corresponding memory location should be accessed when using the template, and if the value is a zero, then the corresponding memory location should not be accessed when using the template, or vice versa. As indicated in block 320, the request may include (e.g., as a parameter) the identifier to be associated with the template. The compute device 100 (e.g., the memory controller 106) may provide the template identifier to a requesting device (e.g., the processor 102) after associating the memory locations with the template identifier (e.g., as a return value), as indicated in block 322. In the illustrative embodiment, the compute device 100 (e.g., the memory controller 106) stores the memory locations in association with the template identifier in a memory (e.g., for future reference), as indicated in block 324. As indicated in block 326, the compute device 100 (e.g., the memory controller 106) may store the memory locations and the template identifier in the cross point memory (e.g., the memory media 110). Subsequently, or if the compute device 100 determined, in block 304, not to define a scatter-gather template (e.g., because a scatter-gather template has already been defined), the method 300 advances to block 328 of FIG. 4, in which the compute device 100 determines whether to access the memory 104 (e.g., the memory media 110) using a template (e.g., a scatter-gather template).

Figure 4:
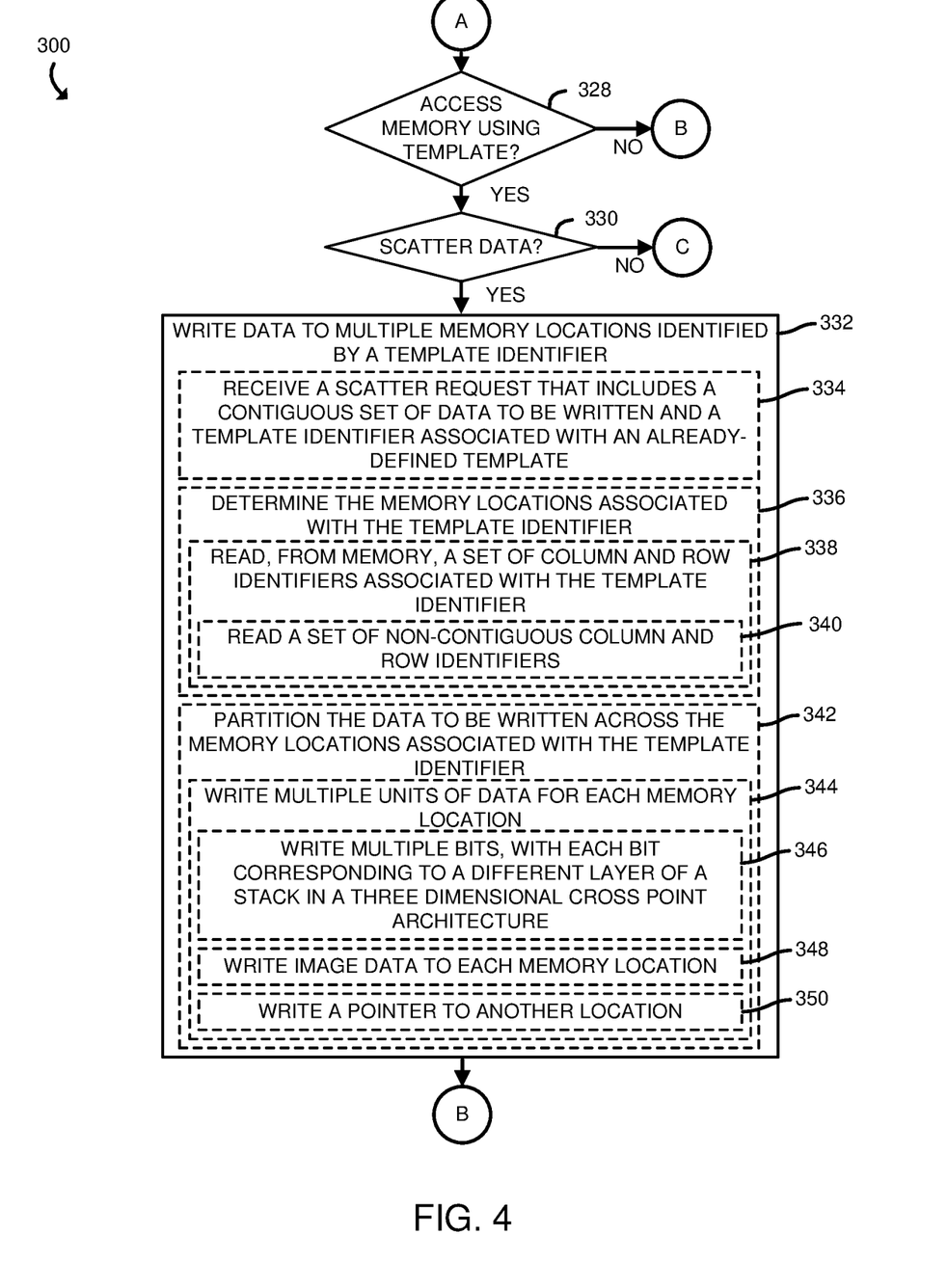

Referring now to FIG. 4, if the compute device 100 determines not to access memory using a template at the present time, the method 300 loops back to block 302 to determine whether to continue to enable efficient scatter-gather operations and potentially define another template or perform a memory access (e.g., a scatter or gather operation) using a defined template. Otherwise (e.g., if the compute device 100 has determined to access the memory 104 (e.g., the memory media 110) using a template, the method 300 advances to block 330 in which the compute device 100 (e.g., the memory controller 106) determines the subsequent course of action as a function of whether the compute device 100 is to scatter data or to gather data. In response to a determination that the compute device 100 is to scatter data using a template, the method 300 advances to block 332, in which the compute device 100 (e.g., the memory controller 106) writes data to multiple memory locations identified by a template identifier. As indicated in block 334, the compute device 100 (e.g., the memory controller 106) may receive a scatter request (e.g., from the processor 102, executing a corresponding application) that includes a contiguous set of data to be written to the memory locations and a template identifier associated with an already-defined template (e.g., a template that was defined in block 306 of FIG. 3).

In block 336, the compute device 100 (e.g., the memory controller 106) determines the memory locations associated with the template identifier. To do so, in the illustrative embodiment, the compute device 100 (e.g., the memory controller 106) reads, from the memory (e.g., the memory media 110), a set of column and row identifiers associated with the template identifier (e.g., column and row identifiers that were written to the memory media 110 in association with the template identifier in block 324 of FIG. 3), as indicated in block 338. In the illustrative embodiment, the compute device 100 (e.g., the memory controller 106) reads a set of non-contiguous column and row identifiers (e.g., at least one of the memory locations defined by a column and row pair is not contiguous with the other memory locations) associated with the template identifier, as indicated in block 340.

Figure 7:
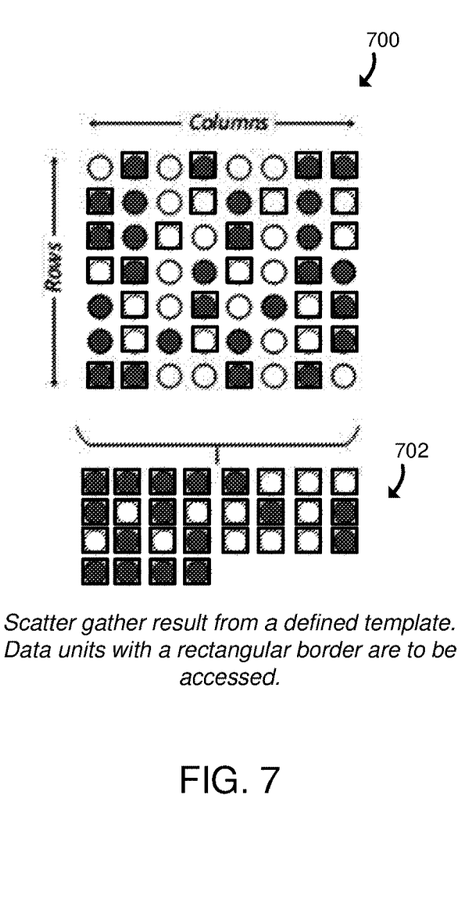
FIG. 7 is a simplified diagram of a mapping of a contiguous data set to locations in a memory media of the compute device of FIG. 1 based on the template of FIG. 6.
Figure 8:
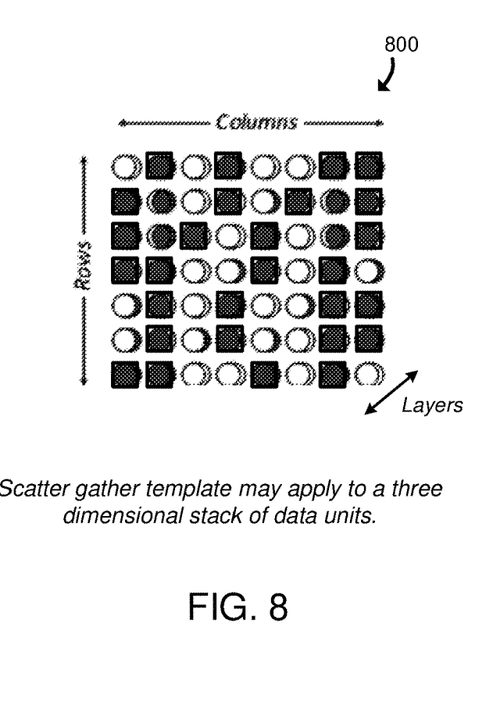
FIG. 8 is a simplified diagram of the template of FIG. 6 applied to at least one embodiment of a memory media that has a three dimensional cross point architecture.

As indicated in block 342, after the compute device 100 (e.g., the memory controller 106) has determined the memory locations, the compute device 100 (e.g., the memory controller 106) partitions the data to be written across the memory locations associated with the template identifier. In doing so, and as indicated in block 344, the compute device 100 (e.g., the memory controller 106) may write multiple units of data for each memory location (e.g., for each column and row pair). For example, and as indicated in block 346, the compute device 100 (e.g., the memory controller 106) may write multiple bits for a given memory location (e.g., column and row pair), with each bit corresponding to a different layer 202, 204, 206 of a three dimensional cross point architecture (e.g., the memory media 110 has a three dimensional cross point architecture). As indicated in block 348, the compute device 100 may write image data (e.g., any data indicative of an image) to each memory location. As another example, the compute device 100 (e.g., the memory controller 106) may write, to a given memory location, a pointer to another location (e.g., a pointer to a location in a database), as indicated in block 350. Referring briefly to FIGS. 6 and 7, as an example, the template 600 is applied to available memory locations 700 in the memory media 110 to select a subset, shown with rectangular borders, to which an array 702 of data is to be written to (e.g., scattered to). Referring to FIG. 8, in embodiments in which the memory media 110 has a three dimensional cross point architecture, multiple data units (e.g., multiple bits) may be written to each column and row pair (e.g., one bit per layer). Returning to FIG. 4, after scattering the data to the memory locations associated with the template, the method 300 loops back to block 302 of FIG. 3, in which the compute device 100 determines whether to continue to enable efficient scatter-gather operations. Referring back to block 330, if the compute device 100 instead determines to gather data (e.g., rather than to scatter data), the method 300 advances to block 352 of FIG. 5, in which the compute device 100 (e.g., the memory controller 106) gathers data from the memory 104 (e.g., the memory media 110).

Figure 5:
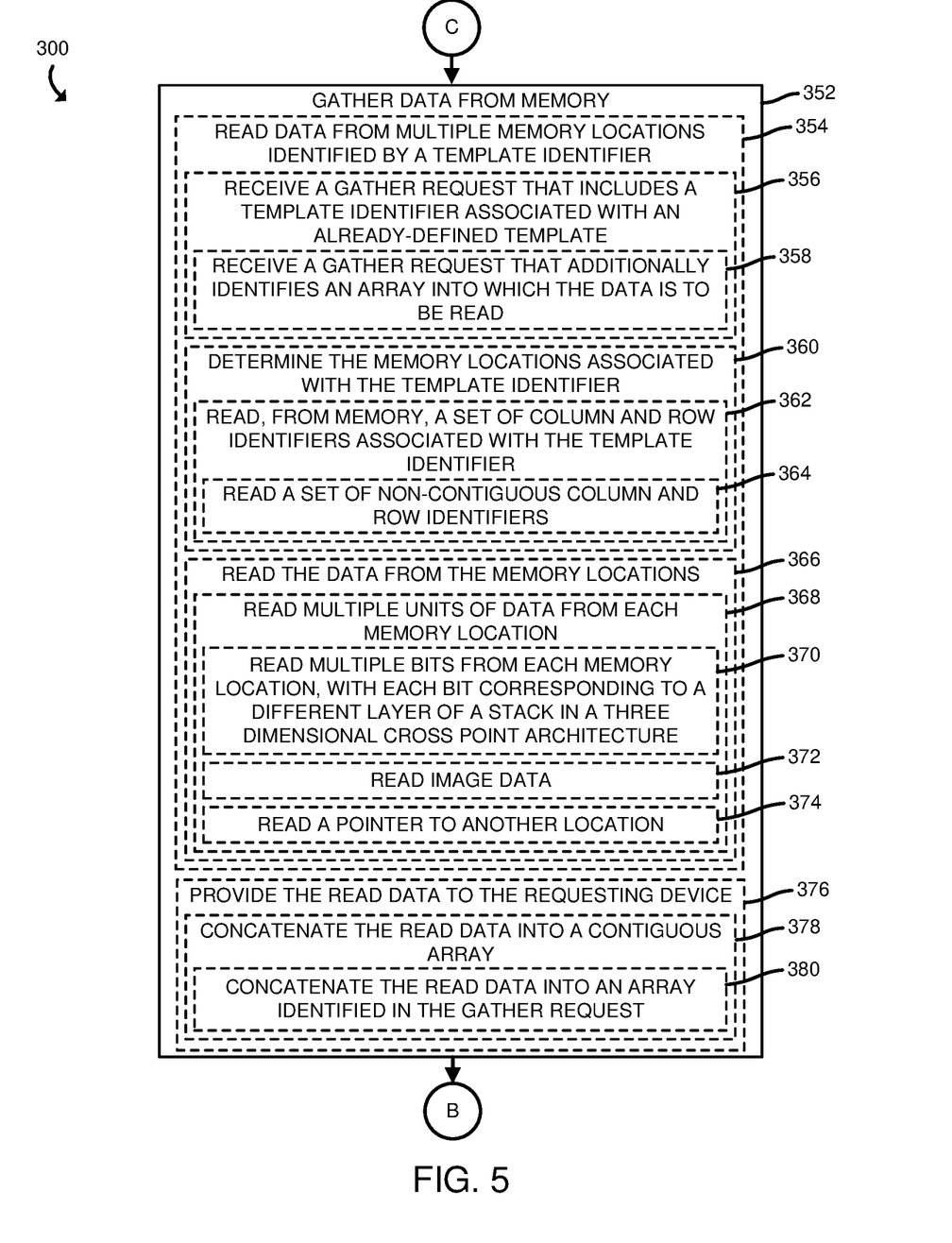

Referring now to FIG. 5, in gathering data from the memory 104, the compute device 100 (e.g., the memory controller 106) reads data from multiple memory locations identified by a template identifier, as indicated in block 354. In doing so, the compute device 100 (e.g., the memory controller 106), in the illustrative embodiment, receives a gather request that includes a template identifier associated with an already-defined template (e.g., a template defined in block 306 of FIG. 3), as indicated in block 356. In the illustrative embodiment, the compute device 100 (e.g., the memory controller 106) receives a gather request (e.g., from the processor 102 executing a corresponding application) that identifies an array (e.g., a pointer to a contiguous memory range) into which the data is to be read, as indicated in block 358. In block 360, the compute device 100 (e.g., the memory controller 106) determines the memory locations associated with the template identifier. To do so, in the illustrative embodiment, the compute device 100 (e.g., the memory controller 106) reads, from memory (e.g., from the memory media 110) a set of column and row identifiers associated with the template identifier, as indicated in block 362. In the illustrative embodiment, and as indicated in block 364, the compute device 100 reads a set of non-contiguous column and row identifiers.

Additionally, the compute device 100 (e.g., the memory controller 106) reads the data from the memory locations associated with the template identifier, as indicated in block 366. In doing so, the compute device 100 (e.g., the memory controller 106) may read multiple units of data from each memory location, as indicated in block 368. For example, the compute device 100 (e.g., the memory controller 106) may read multiple bits from each memory location, with each bit corresponding to a different layer 202, 204, 206 of a stack in a three dimensional cross point architecture (e.g., the memory media 110 has a three dimensional cross point architecture), as indicated in block 370. In reading the data, the compute device 100 (e.g., the memory controller 106) may read image data (e.g., any data indicative of an image) from each memory location, as indicated in block 372. As another example, the compute device 100 (e.g., the memory controller 106) may read, from a given memory location, a pointer to another location (e.g., a location in a database), as indicated in block 374. In block 376, in the illustrative embodiment, the compute device 100 (e.g., the memory controller 106) provides the read data to a requesting device (e.g., to the processor 102). In doing so, the compute device 100 (e.g., the memory controller 106) concatenates the read data from the multiple memory locations associated with the template into a contiguous array, as indicated in block 378. For example, and as indicated in block 380, the memory controller 106 may concatenate the read data into the array identified in the gather request (e.g., the array described with reference to block 358). Subsequently, the method 300 loops back to block 302 in which the compute device 100 determines whether to continue to enable efficient scatter-gather operations.

EXAMPLES

Illustrative examples of the technologies disclosed herein are provided below. An embodiment of the technologies may include any one or more, and any combination of, the examples described below.

Example 1 includes a device comprising circuitry to associate a set of non-contiguous memory locations of a memory having a cross point architecture with a template identifier; and access, in response to a request that identifies the non-contiguous memory locations by the template identifier, the memory locations.

Example 2 includes the subject matter of Example 1, and wherein to associate a set of memory locations of a memory having a cross point architecture with a template identifier comprises to associate a set of a memory locations of a memory having a three dimensional cross point architecture with the template identifier.

Example 3 includes the subject matter of any of Examples 1 and 2, and wherein to associate a set of memory locations of a memory having a cross point architecture with a template identifier comprises to associate a set of column and row identifiers with the template identifier.

Example 4 includes the subject matter of any of Examples 1-3, and wherein to associate the set of column and row identifiers with the template identifier comprises to associate a set of column and row coordinates that each represent multiple bits with a template identifier.

Example 5 includes the subject matter of any of Examples 1-4, and wherein to associate a set of memory locations of a memory having a cross point architecture with a template identifier comprises to receive a request to define a template and associate, in response to the request, the set of memory locations with the template identifier.

Example 6 includes the subject matter of any of Examples 1-5, and wherein to receive a request comprises to receive a request that includes a mask indicative of the memory locations to be associated with the template identifier.

Example 7 includes the subject matter of any of Examples 1-6, and wherein to receive a request comprises to receive a request that includes the template identifier to be associated with the memory locations.

Example 8 includes the subject matter of any of Examples 1-7, and wherein the circuitry is further to provide the template identifier in a response to the request after the memory locations have been associated with the template identifier.

Example 9 includes the subject matter of any of Examples 1-8, and wherein to associate the set of non-contiguous memory locations with the template identifier comprises to store the memory locations in association with the template identifier in the memory.

Example 10 includes the subject matter of any of Examples 1-9, and wherein to access the memory locations comprises to write data to the memory locations.

Example 11 includes the subject matter of any of Examples 1-10, and wherein to write data to the memory locations comprises to determine the non-contiguous memory locations associated with the template identifier; and partition a contiguous set of data from the request across the non-contiguous memory locations associated with the template identifier.

Example 12 includes the subject matter of any of Examples 1-11, and wherein to determine the non-contiguous memory locations associated with the template identifier comprises to read, from the memory, a set of non-contiguous column and row identifiers associated with the template identifier.

Example 13 includes the subject matter of any of Examples 1-12, and wherein the memory has a three dimensional cross point architecture and to partition the contiguous set of data across the non-contiguous memory locations comprises to write multiple bits of the set of data to a memory location, wherein each bit corresponds with a different layer of the three dimensional cross point architecture at the memory location.

Example 14 includes the subject matter of any of Examples 1-13, and wherein to partition the contiguous set of data across the non-contiguous memory locations comprises to write multiple bits associated with image data to a memory location.

Example 15 includes the subject matter of any of Examples 1-14, and wherein to partition the contiguous set of data across the non-contiguous memory locations comprises to write, to a memory location, multiple bits indicative of a pointer to another location.

Example 16 includes the subject matter of any of Examples 1-15, and wherein access the memory locations comprises to read data from the memory locations.

Example 17 includes the subject matter of any of Examples 1-16, and wherein to read data from the memory locations comprises to determine the non-contiguous memory locations associated with the template identifier; and concatenate the data from the non-continuous memory locations into a contiguous array.

Example 18 includes the subject matter of any of Examples 1-17, and wherein the memory has a three dimensional cross point architecture and to read data from the memory locations comprises to read multiple bits from a memory location, wherein each bit corresponds with a different layer of the three dimensional cross point architecture.

Example 19 includes a method comprising associating, by a device, a set of non-contiguous memory locations of a memory having a cross point architecture with a template identifier; and accessing, by the device and in response to a request that identifies the non-contiguous memory locations by the template identifier, the memory locations.

Example 20 includes one or more machine-readable storage media comprising a plurality of instructions stored thereon that, in response to being executed, cause a device to associate a set of non-contiguous memory locations of a memory having a cross point architecture with a template identifier; and access, in response to a request that identifies the non-contiguous memory locations by the template identifier, the memory locations.

The invention claimed is:
1. A device comprising:
circuitry to:
associate a set of non-contiguous memory locations of a memory having a three dimensional cross point architecture with a template identifier; and
access the non-contiguous memory locations in response to a request that identifies the non-contiguous memory locations by the template identifier, including to access multiple bits at a memory location, wherein each of the multiple bits corresponds with a different layer of the memory at the memory location.
2. The device of claim 1, wherein to associate a set of non-contiguous memory locations of a memory having a three dimensional cross point architecture with a template identifier comprises to associate a set of column and row identifiers with the template identifier.

3. The device of claim 2, wherein to associate the set of column and row identifiers with the template identifier comprises to associate a set of column and row coordinates that each represent multiple bits with a template identifier.

4. The device of claim 1, wherein to associate a set of non-contiguous memory locations of a memory having a three dimensional cross point architecture with a template identifier comprises to receive a request to define a template and associate, in response to the request, the set of non-contiguous memory locations with the template identifier.

5. The device of claim 4, wherein to receive a request to define the template comprises to receive a request that includes a mask indicative of the set of non-contiguous memory locations to be associated with the template identifier.

6. The device of claim 4, wherein to receive a request to define the template comprises to receive a request that includes the template identifier to be associated with the set of non-contiguous memory locations.

7. The device of claim 4, wherein the circuitry is further to provide the template identifier in a response to the request to define the template after the set of non-contiguous memory locations have been associated with the template identifier.

8. The device of claim 1, wherein to associate the set of non-contiguous memory locations with the template identifier comprises to store the set of non-contiguous memory locations in association with the template identifier in the memory.

9. The device of claim 1, wherein to access the non-contiguous memory locations comprises to write data to the non-contiguous memory locations.

10. The device of claim 9, wherein to write data to the non-contiguous memory locations comprises to:
determine the non-contiguous memory locations associated with the template identifier; and
partition a contiguous set of data from the request across the non-contiguous memory locations associated with the template identifier.

11. The device of claim 10, wherein to determine the non-contiguous memory locations associated with the template identifier comprises to read, from the memory, a set of non-contiguous column and row identifiers associated with the template identifier.

12. The device of claim 10, wherein to partition the contiguous set of data across the non-contiguous memory locations comprises to write multiple bits of the contiguous set of data to the memory location, wherein each bit corresponds with a different layer of the three dimensional cross point architecture at the memory location.

13. The device of claim 10, wherein to partition the contiguous set of data across the non-contiguous memory locations comprises to write multiple bits associated with image data to the memory location.

14. The device of claim 10, wherein to partition the contiguous set of data across the non-contiguous memory locations comprises to write, to the memory location, multiple bits indicative of a pointer to another location.

15. The device of claim 1, wherein to access the non-contiguous memory locations comprises to read data from the non-contiguous memory locations.

16. The device of claim 15, wherein to read data from the non-contiguous memory locations comprises to:
determine the non-contiguous memory locations associated with the template identifier; and
concatenate the data from the non-contiguous memory locations into a contiguous array.

17. The device of claim 15, wherein to read data from the non-contiguous memory locations comprises to read multiple bits from the memory location, wherein each bit corresponds with a different layer of the three dimensional cross point architecture.

18. A method comprising:
associating, by a device, a set of non-contiguous memory locations of a memory having a three dimensional cross point architecture with a template identifier; and
accessing, by the device and in response to a request that identifies the non-contiguous memory locations by the template identifier, the non-contiguous memory locations, including to access multiple bits at a memory location, wherein each of the multiple bits corresponds with a different layer of the memory at the memory location.

19. One or more machine-readable storage media comprising a plurality of instructions stored thereon that, in response to being executed, cause a device to:
associate a set of non-contiguous memory locations of a memory having a three dimensional cross point architecture with a template identifier; and
access the non-contiguous memory locations in response to a request that identifies the non-contiguous memory locations by the template identifier, including to access multiple bits at a memory location, wherein each of the multiple bits corresponds with a different layer of the memory at the memory location.

* * * * *